(12) United States Patent
Lewis et al.

(10) Patent No.: US 11,963,342 B2
(45) Date of Patent: Apr. 16, 2024

(54) SYSTEM, APPARATUS, AND METHOD FOR ELECTROMAGNETIC INTERFERENCE MITIGATION

(71) Applicant: Hydrocision, Inc., North Billerica, MA (US)

(72) Inventors: Mark Lewis, Haverhill, MA (US); David E. Cassidy, Chelmsford, MA (US)

(73) Assignee: Hydrocision, Inc., North Billerica, MA (US)

( * ) Notice: Subject to any disclaimer, the term of this patent is extended or adjusted under 35 U.S.C. 154(b) by 245 days.

(21) Appl. No.: 17/522,842

(22) Filed: Nov. 9, 2021

(65) Prior Publication Data

US 2022/0151118 A1 May 12, 2022

Related U.S. Application Data

(60) Provisional application No. 63/111,134, filed on Nov. 9, 2020.

(51) Int. Cl.
*H05K 9/00* (2006.01)
(52) U.S. Cl.
CPC ......... *H05K 9/0071* (2013.01); *H05K 9/0066* (2013.01)
(58) Field of Classification Search
CPC .................. H05K 9/0066; H05K 9/0071
See application file for complete search history.

(56) References Cited

U.S. PATENT DOCUMENTS

| | | | |
|---|---|---|---|
| 5,119,266 A * | 6/1992 | Petry | H05K 9/0066 361/708 |
| 5,195,232 A * | 3/1993 | Frederick | H05K 9/0066 29/855 |
| 5,223,806 A | 6/1993 | Curtis et al. | |
| 6,055,164 A * | 4/2000 | Chen | H02M 1/44 363/39 |
| 6,741,162 B1 | 5/2004 | Sacca | |
| 6,757,386 B1 * | 6/2004 | Latu | H05K 1/0231 379/416 |

(Continued)

FOREIGN PATENT DOCUMENTS

EP 2662996 B1 8/2016

OTHER PUBLICATIONS

International Search Report and Written Opinion of the International Searching Authority in relation to international application No. PCT/US2021/058671, dated Feb. 24, 2022, 7 pages.

*Primary Examiner* — Hung V Ngo
(74) *Attorney, Agent, or Firm* — Bochner PLLC; Andrew D. Bochner

(57) ABSTRACT

Provided is an electromagnetic interference mitigation apparatus including a power supply; a power cord; a power supply chassis encapsulating at least the power supply, the power supply physically isolated from the power cord; a low value resistor in electrical communication with at least the power cord and the power supply; and a capacitor disposed between the power supply chassis and an equipment chassis, wherein the equipment chassis encapsulates the power supply chassis, wherein the equipment chassis is disposed a distance from the power supply chassis, and wherein the capacitor is formed by the equipment chassis and the power supply chassis.

9 Claims, 3 Drawing Sheets

(56) References Cited

U.S. PATENT DOCUMENTS

| | | | |
|---|---|---|---|
| 8,599,575 B1 * | 12/2013 | McNally | H05K 9/0066 361/818 |
| 8,787,037 B2 * | 7/2014 | Sakoda | H05K 9/0066 361/752 |
| 2003/0130017 A1 | 7/2003 | Shiotsu et al. | |
| 2017/0094845 A1 * | 3/2017 | Okada | H05K 9/0098 |
| 2017/0136882 A1 | 5/2017 | Ricci et al. | |
| 2023/0247787 A1 * | 8/2023 | Eriksen | H05K 7/1462 361/807 |

* cited by examiner

SYSTEM, APPARATUS, AND METHOD FOR ELECTROMAGNETIC INTERFERENCE MITIGATION

CLAIM OF PRIORITY

This application claims priority from U.S. Provisional Patent Application No. 63/111,134, filed on Nov. 9, 2020, the contents of which are incorporated herein by reference.

FIELD OF THE INVENTION

The present disclosure relates to a medical device. More specifically, the present disclosure relates to a system, apparatus, and method for electromagnetic interference mitigation as related to medical and laboratory equipment.

INTRODUCTION

Leading technology analysts believe that technology is advancing at a near exponential rate. Many industries that once utilized manual tools and primitive processes have been revolutionized by the integration of microcomputers, sensors, and other modern components. Consequently, there are more computer hardware and circuits in individual's homes and workplaces then ever before. This inundation of electronics leads to two issues relating to electromagnetic interference ("EMI"). The first being that there are a great number of devices that are now susceptible to error due to EMI. The second being that there is an even greater number of devices that are contributing to EMI.

EMI can catastrophically affect the performance of electronic devices, induce errors in operation, and cause total failure. Again, these problems are amplified by the fact that these EMI emitting devices are becoming more popular every year. In particular, wireless technologies like cell phones, portables computers, Bluetooth, GPS, and Wi-FI, are exasperating the EMI problem.

EMI may be classified into two categories: conducted EMI and radiated EMI. Conducted EMI occurs from physical contact of conductors, while radiated EMI occurs from induction, thus contactless. Typically, conducted EMI is the result of lower frequencies and radiated EMI results from higher frequencies. EMI is also commonly produced by less sophisticated components, like generators and motors. Such components often comprise switch mode power supplies that both radiate and conduct EMI due to high switching speeds.

Specifically, hospital equipment may be detrimentally affected by EMI. Equipment like life support systems, vital monitoring devices, ventilators, and more is vulnerable and must be shielded from EMI accordingly. This issue of EMI in hospitals is particularly complicated because often the source of EMI is another incredibly important piece of medical equipment.

To alleviate the issue of EMI, "x capacitors" may be installed at the power cord input to conduct currents from the chassis and wiring back into the power supply, instead of along the power cord. While these "x capacitors" work well under many circumstances, "x capacitors" may increase the ground current flowing into the earth. However, medical devices are unique in that the earth ground currents must be minimized to ensure that a patient's electrical equipment does not malfunction. Conversely, if the "x capacitors" are made small, there may be less ground current, but EMI will be poorly mitigated.

It would be desirable, therefore, to provide systems and methods that solve the issue of reducing EMI in environments when an earth ground is not favorable. It is common that a device may fail to meet safety guidelines regarding EMI in the lower frequency range. To reduce the low frequency emissions without effecting the high frequency emissions, it would be desirable if the chassis of the power supply may be electrically isolated from earth ground.

It would further be desirable to resolve the deficiencies in current EMI mitigation technology by creating a capacitor, where the plates of the capacitor are the walls of the power supply chassis and the equipment chassis.

SUMMARY

In an embodiment, the invention of the present disclosure may be an electromagnetic interference mitigation apparatus comprising a power supply; a power cord; a power supply chassis encapsulating at least the power supply, the power supply physically isolated from the power cord; a low value resistor in electrical communication with at least the power cord and the power supply; and a capacitor disposed between the power supply chassis and an equipment chassis, wherein the equipment chassis encapsulates the power supply chassis, wherein the equipment chassis is disposed a distance from the power supply chassis, and wherein the capacitor is formed by the equipment chassis and the power supply chassis.

Further, the low value resistor may be placed in series with the power supply and the power cord. The apparatus may further comprise a first x capacitor and a second x capacitor, wherein the first x capacitor and the second x capacitor may be disposed within the power supply chassis. In an embodiment, the capacitor may act as a high pass filter configured to reduce low frequencies emitting from the power supply.

In an embodiment, the power supply chassis forms a first plate of the capacitor and the equipment chassis forms a second plate of the capacitor. Further, a dielectric material may be disposed between the first plate and the second plate. In an embodiment, the distance between the plates is between 0.055 inches and 0.070 inches. The low value resistor may have a resistance of less than 100 Ohms. In an embodiment, the power cord inputs 90-264 Vac to the power supply and the power supply outputs 48 Vdc at 15.6 Amps Max.

BRIEF DESCRIPTION OF THE DRAWINGS

The incorporated drawings, which are incorporated in and constitute a part of this specification exemplify the aspects of the present disclosure and, together with the description, explain and illustrate principles of this disclosure.

DETAILED DESCRIPTION

Disclosed herein are devices, systems, and methods for mitigating electromagnetic interference in electronic devices.

For this disclosure, singular words should be construed to include their plural meaning, unless explicitly stated otherwise. Additionally, the term "including" is not limiting. Further, "or" is equivalent to "and/or," unless explicitly stated otherwise. Although, ranges may be stated as preferred, unless stated explicitly, there may exist embodiments that operate outside of preferred ranges.

Figure 1A:
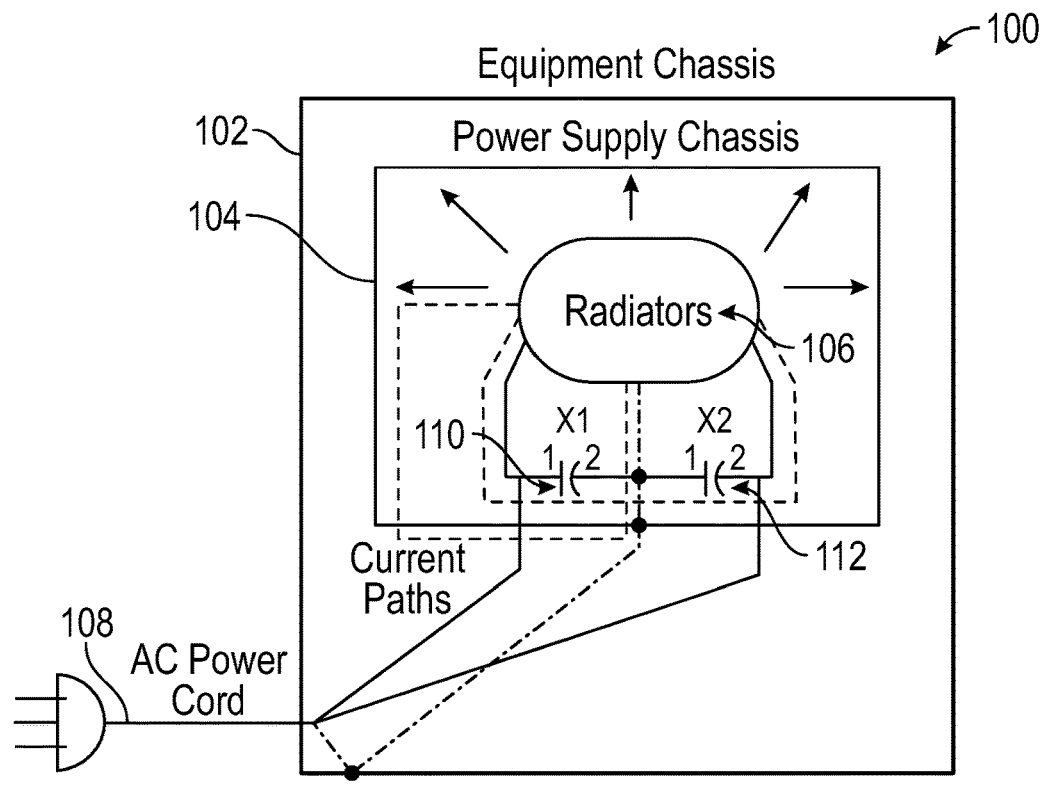
FIG. 1A illustrates an embodiment of desirable electromagnetic interference mitigation.

FIG. 1A illustrates an example of ideal electromagnetic interference mitigation. For example, FIG. 1 illustrates a functioning piece of hospital equipment, yet devoid of EMI. For the purposes of this disclosure, FIG. 1A may represent a desired outcome of EMI mitigations methods.

Figure 1B:
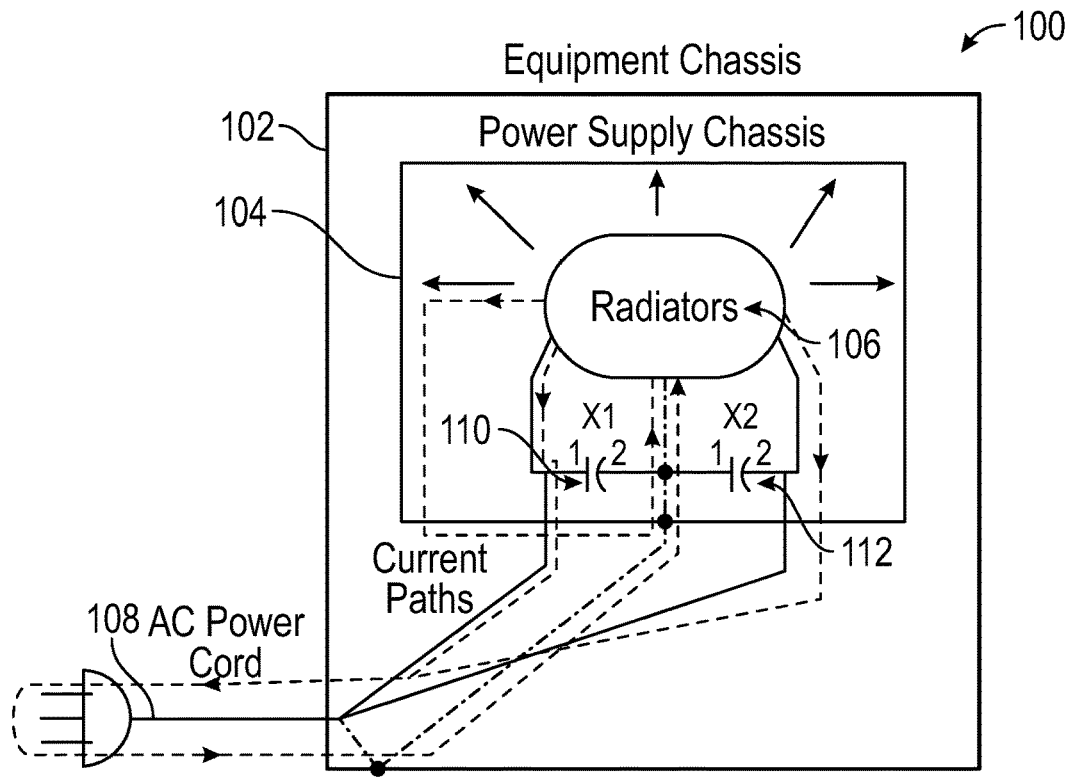
FIG. 1B illustrates an embodiment of undesirable electromagnetic interference.

FIG. 1B illustrates an example of an apparatus that is allowing low frequency emissions to travel through the apparatus' ground. Thus, for the purposes of this disclosure, FIG. 1B may represent a system having an undesirable quantity of EMI.

Figure 1C:
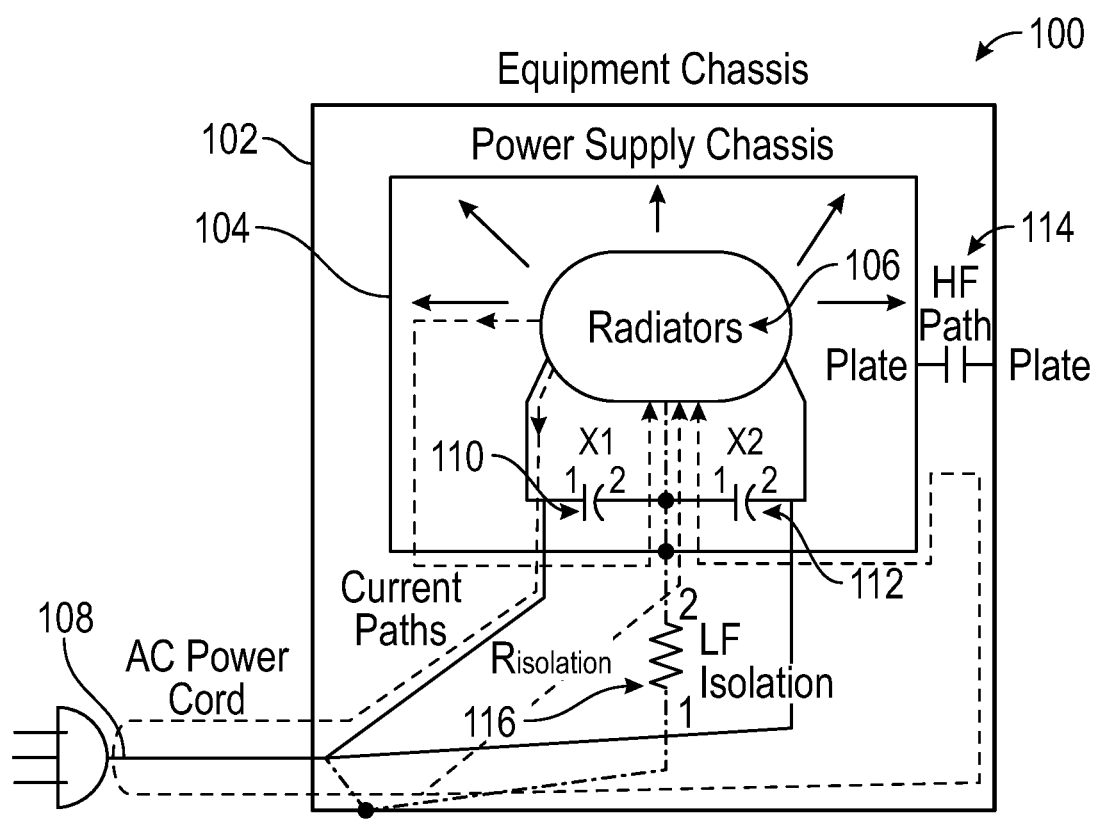
FIG. 1C illustrates an embodiment of an apparatus configured to mitigate electromagnetic interference.

Referring to FIG. 1C, the device 100 may include an equipment chassis 102, a power supply chassis 104, a power supply 106, a power cord 108, a first x capacitor 110, a second x capacitor 112, a low value series resistor 116, and a capacitor/high pass filter 114.

The capacitor 114 may be created when the equipment chassis 102 and power supply chassis 104 are disposed at a distance, such as, for example, 0.055-0.070 inches, or any other suitable distance from one another. In an embodiment the capacitor distance is measured between the walls of the equipment chassis 102 and power supply chassis 104 where the two chassis 102/104 are physically closest to one another. However, in other embodiments, the capacitor distance may be measured in other manners, for example, at a position where one of the chassis is holding the most charge. In an embodiment, each chassis 102/104 may have four surrounding walls, a top wall, and a bottom wall. In such an embodiment, the capacitor 114 may be formed along two corresponding walls of the chassis 102/104. Further, in such an embodiment, the distance between the two corresponding walls (the walls forming the capacitor 114) may be shorter than the distances between other corresponding walls (for example, the distance between the equipment chassis 102 left wall and the power supply chassis 104 left wall). Thus, the walls of the chassis 102/104 forming the capacitor 114, may be the closest corresponding walls. However, in other embodiments, the capacitor 114 may be formed by any number or combination of walls at any distance.

In an embodiment, the capacitor distance is adjustable by the user, manually, automatically, or by an attached computer. In an embodiment, a servomotor or other similar component is disposed between the chassis 102/104 such that the capacitor distance may be changed. In an embodiment, the variable distance is fixed, thus non-adjustable. In an embodiment, a winch, wedge, or screw, is disposed between the power supply chassis 104 and the equipment chassis 102 that enables the capacitor distance to be fine-tuned. Such embodiments and similar alternate embodiments are represented by FIG. 1C.

The apparatus 100 may include an equipment chassis 102 and a power supply chassis 104. In many embodiments, the power supply chassis 104 surrounds a power supply 106. In an example, the power supply 106 may include an electrical input/output, for example, an input of 90-264 Vac, and/or output of 48 Vdc at 15.6 Amps Max. However, the power supply 106 may have any suitable electrical input or output. The power supply 106 may be an AC power supply, a DC power supply, or any other commonly used type of power supply. In alternate embodiments, the power supply chassis 104 surrounds multiple power supplies 106. In a further embodiment, the equipment chassis 102 surrounds a plurality of power supply chassis 104.

In an embodiment, both the equipment chassis 102 and power supply chassis 104 are composed of metal and act as electrical conductors. However, there exist alternate embodiments where the equipment chassis 102 and power supply chassis 104 are made from various suitable materials. For example, in another embodiment, the equipment chassis 102 and/or the power supply chassis 104 may be composed of or include thin films, foil, or electrolytes. In alternative embodiments, one of the two chassis is constructed from a material that is designed to be less conductive than the other chassis. In this alternate embodiment the less conductive chassis may decrease the overall effectiveness of the capacitor created by the two chassis. This alternative embodiment may decrease the effectiveness of the high pass filter 114, which may benefit a user who is seeking to decrease the percentage of high frequency that passes through the capacitor 114.

In an embodiment, a dielectric material is disposed between the equipment chassis 102 and the power supply chassis 104. For example, in various embodiments, glass, Teflon, polystyrene, titanium dioxide, barium titanate, or other dielectric materials may be placed between the two chassis 102/104. In an embodiment, the power supply chassis 104, the equipment chassis 102, and any other chassis or components, are insulated. In an embodiment, the power supply chassis 104, the equipment chassis 102, and any other chassis or components, may be insulated from electricity, heat, vibration, or sound.

There exist further embodiments where the equipment chassis 102 and the power supply chassis 104 do not form the capacitor 114. In these alternative embodiments an independent capacitor may be disposed between the two chassis 102/104. Alternatively, a power supply chassis 104 may not surround the power supply 106. In such an embodiment, another component, for example, a metallic plate, may be connected in electrical communication to the power supply 106 such that this other component forms half of the capacitor 114 and the equipment chassis 102 forms the other half. In an embodiment, the power supply 106 is connected to a separate ground or other cable that is configured to carry low frequencies.

Figure 2:
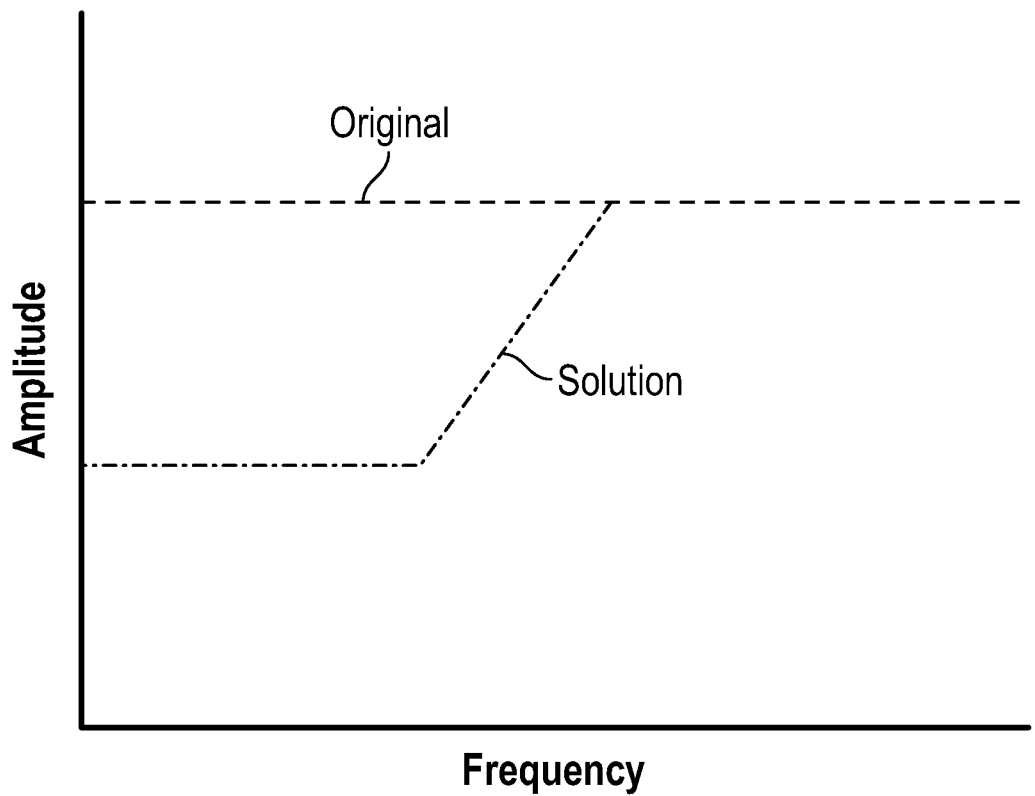
FIG. 2 illustrates a graph showing frequency response.

Although in some embodiments the capacitor 114 may act as a high pass filter, the capacitor 114 may also be configured as a low pass filter. Referring to FIG. 2, an embodiment of the electromagnetic interference mitigation apparatus 100 reduces low frequency emissions. This is evident from FIG. 2, which illustrates how an embodiment of the invention of the present disclosure may decrease the amplitude of emissions in the low frequency range. Referring to FIG. 2, although an embodiment of the electromagnetic interference mitigation apparatus 100 is configured to decrease the low frequency emission, the present invention is not limited to the slope and characteristics of FIG. 2. There exist a number of embodiments that enable the user of the apparatus 100 to tailor the intensity of the effect of the apparatus 100 for a specific application. In such embodiments, the invention of the present disclosure may have more or less of an affect on emissions than illustrated in FIG. 2.

In some embodiments the power supply chassis 104 and/or equipment chassis 102 are constructed from one continuous sheet. For example, in these continuous sheet embodiments, the entire chassis 102/104 may be milled, 3D printed, molded, or otherwise manufactured such that the chassis 102/104 is one piece. Alternatively, there are embodiments where either one or both of the power supply chassis 104 and the equipment chassis 102 are constructed from multiple portions. For example, in these alternative embodiments, either chassis 102/104 may comprise a top side, a bottom side, a left side, a right side, a front side, and a rear side. Further, the top side, the bottom side, the left side, the right side, the front side, and the rear side, may be independent components, each of which are fastened to create the equipment chassis 102 or power supply chassis 104.

There exist alternate embodiments where either of the chassis 102/104 are not uniformly composed of the same material. For example, 90% of the chassis may be composed of a metal known in the arts to act as a sufficient conductor and 10% of the chassis may be composed of a material known either as a weak conductor or insulator. Such an embodiment may be beneficial in applications where there exist sensitive components that must reside within the chassis but must not come within a certain proximity of a electrically conducting material.

Alternatively, in an embodiment, the equipment chassis 102 and/or the power supply chassis 104 may be a mesh, chain link, foil, or other malleable material disposed around the components that reside within said chassis. For example, in applications where a traditional, fixed, geometric, or physically impermeable chassis is not conducive, a malleable material may "blanket" the components that would normally reside within said chassis. In this alternate embodiment the malleable material composing the chassis may have many of same properties (for example, conductivity, material, dielectric, etc.) as the traditional chassis previously disclosed.

In an embodiment of the electromagnetic interference mitigation apparatus, the apparatus further comprises a low value resistor 116. This low value resistor 116 may be less than 100 ohms. In certain embodiments, a lower resistance may be associated with a higher amplitude of low-frequency conductivity, and/or a higher resistance may be associated with a greater amount of radiated emissions. In one embodiment, the resistance may be approximately 56 ohms. However, there exist alternate embodiments where the low value resistor 116 may be greater than 100 ohms. In an embodiment, the low value resistor 116 is connected to at least the power supply 106 and earth ground and/or power cord 108 in series. However, there are further embodiments where the low value resistor 116 is connected to at least the power supply 106 and earth ground and/or power cord 108 in parallel.

There exist additional embodiments where the electromagnetic interference mitigation apparatus 100 includes more than one low value resistors 116. In these alternative embodiments the plurality of low value resistors 116 may be connected to at least the power supply 106 and earth ground and/or power cord 108 in series or parallel. In an embodiment the low value resistor 116 is a variable resistor. In such an embodiment the low value resistor 116 is be easily adjustable by the user.

Figure 3:
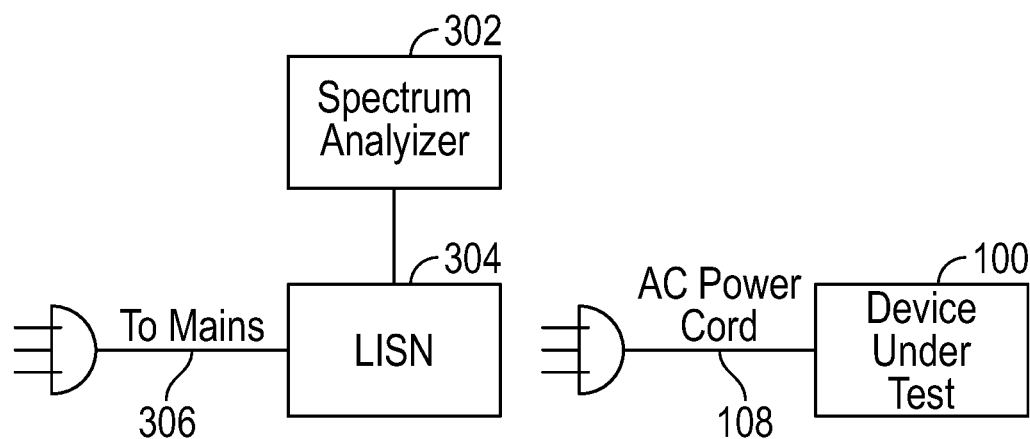
FIG. 3 illustrates an embodiment of a conductive electromagnetic compatibility test setup.

The electromagnetic interference mitigation apparatus 100 may be configured to combat conductive electromagnetic interference frequencies in the range of 100 Khz to 30 Mhz along the AC power cord 108 of the device under test. Referring to FIG. 3, the electromagnetic interference emissions may be measured by connecting the AC power cord 108 of the device 100 under test to a line impedance stabilization network 304, where a spectrum analyzer 302 is in further communication to the line impedance stabilization network 304. The line impedance stabilization network 304 may then be connected to the main power 306. However, there exist embodiments where the conductive electromagnetic interference emissions are measured using other methods and/or components.

In alternate embodiments, the invention of the present disclosure seeks to combat conductive electromagnetic interference outside the range of 100 Khz to 30 Mhz. In further embodiments, the apparatus 100 combats conductive electromagnetic interference emissions that travel along components other than the AC power cord 108. For example, in these further embodiments, the electromagnetic interference mitigation apparatus 100 may be configured to decrease emissions along the following, but not limited to, cords attaching peripheral devices to the device under test, frames or structures supporting the device under test, or other electronic devices in close proximity to the device under test.

In an embodiment, the electromagnetic interference mitigation apparatus may include a power supply, a power cord, and a power supply chassis encapsulating at least the power supply. In such an embodiment, the power supply may be physically isolated from the power cord. However, the power supply may be in electrical communication with the power cord (for example, via additional circuits, wires, etc.). The apparatus may also include a low value resistor and a capacitor. The low value resistor may be in electrical communication with at least the power cord and the power supply and the capacitor may be disposed between the power supply chassis and an equipment chassis. In an embodiment, the equipment chassis encapsulates the power supply chassis, the equipment chassis is disposed a distance from the power supply chassis, and the capacitor is formed by the equipment chassis and the power supply chassis. The low value resistor may be positioned in series with the power supply and the power cord.

In a further embodiment, the apparatus includes a first x capacitor and a second x capacitor, where the first x capacitor and the second x capacitor are disposed within the power supply chassis. The capacitor may be configured as a high pass filter, where it is further configured to reduce low frequencies emitting from the power supply. The power supply chassis may form a first plate of the capacitor and the equipment chassis may form a second plate of the capacitor. In a further embodiment, a dielectric material is disposed between the first plate and the second plate. Moreover, a distance may exist between the two plates, where the distance may be between 0.055 inches and 0.070 inches. However, the distance may be any suitable measurement. In one embodiment, the low value resistor includes a resistance of less than 100 Ohms. In a further embodiment, the power cord inputs 90-264 Vac to the power supply and the power supply outputs 48 Vdc at 15.6 Amps Max.

While this invention has been described in conjunction with the embodiments outlined above, many alternatives, modifications and variations will be apparent to those skilled in the art upon reading the foregoing disclosure. Accordingly, the embodiments of the invention, as set forth above, are intended to be illustrative, not limiting. Various changes may be made without departing from the spirit and scope of the invention.

What is claimed is:

1. An electromagnetic interference mitigation apparatus comprising:
a power supply;
a power cord;

a power supply chassis encapsulating at least the power supply, the power supply physically isolated from the power cord;

a low value resistor in electrical communication with at least the power cord and the power supply; and a capacitor disposed between the power supply chassis and an equipment chassis, wherein the equipment chassis encapsulates the power supply chassis, wherein the equipment chassis is disposed a distance from the power supply chassis, and wherein the capacitor is formed by the equipment chassis and the power supply chassis.

2. The electromagnetic interference mitigation apparatus of claim 1, wherein the low value resistor is placed in series with the power supply and the power cord.

3. The electromagnetic interference mitigation apparatus of claim 1, further comprising a first x capacitor and a second x capacitor, wherein the first x capacitor and the second x capacitor are disposed within the power supply chassis.

4. The electromagnetic interference mitigation apparatus of claim 1, wherein the capacitor acts as a high pass filter configured to reduce low frequencies emitting from the power supply.

5. The electromagnetic interference mitigation apparatus of claim 1, wherein the power supply chassis forms a first plate of the capacitor and the equipment chassis forms a second plate of the capacitor.

6. The electromagnetic interference mitigation apparatus of claim 5, wherein a dielectric material is disposed between the first plate and the second plate.

7. The electromagnetic interference mitigation apparatus of claim 6, wherein the distance is between 0.055 inches and 0.070 inches.

8. The electromagnetic interference mitigation apparatus of claim 7, wherein the low value resistor includes a resistance of less than 100 Ohms.

9. The electromagnetic interference mitigation apparatus of claim 8, wherein the power cord inputs 90-264 Vac to the power supply and the power supply outputs 48 Vdc at 15.6 Amps Max.

* * * * *